United States Patent
Witzigmann et al.

(10) Patent No.: US 7,095,766 B2
(45) Date of Patent: Aug. 22, 2006

(54) MECHANICAL PROTECTION FOR SEMICONDUCTOR EDGE-EMITTING RIDGE WAVEGUIDE LASERS

(75) Inventors: Bernd Witzigmann, Burbank, CA (US); Trinh D. Nguyen, San Gabriel, CA (US); Charles Su-Chang Tsai, Hacienda Heights, CA (US)

(73) Assignee: Emcore Corporation, Albuquerque, NM (US)

( * ) Notice: Subject to any disclaimer, the term of this patent is extended or adjusted under 35 U.S.C. 154(b) by 92 days.

(21) Appl. No.: 10/602,298

(22) Filed: Jun. 24, 2003

(65) Prior Publication Data

US 2004/0264529 A1 Dec. 30, 2004

(51) Int. Cl.
*H01S 5/00* (2006.01)

(52) U.S. Cl. .................................................. 372/43.01
(58) Field of Classification Search ............. 372/43.01; 257/459

See application file for complete search history.

(56) References Cited

U.S. PATENT DOCUMENTS

| | | | | |
|---|---|---|---|---|
| 5,138,626 A * | 8/1992 | Yap | | 372/46 |
| 5,305,340 A | 4/1994 | Antreasyan et al. | | 372/43 |
| 5,399,885 A * | 3/1995 | Thijs et al. | | 257/95 |
| 5,481,559 A * | 1/1996 | Kawamura | | 372/50 |
| 6,172,382 B1 * | 1/2001 | Nagahama et al. | | 257/94 |
| 6,191,464 B1 * | 2/2001 | Barnard | | 257/427 |
| 6,335,215 B1 * | 1/2002 | Yuang | | 438/31 |
| 6,365,968 B1 | 4/2002 | Qian et al. | | 257/739 |
| 6,375,364 B1 * | 4/2002 | Wu | | 385/88 |
| 6,411,642 B1 * | 6/2002 | Mazed | | 372/103 |
| 6,499,888 B1 * | 12/2002 | Wu | | 385/88 |
| 6,574,379 B1 * | 6/2003 | Miyazaki | | 385/1 |
| 2002/0054724 A1 * | 5/2002 | Tada et al. | | 385/2 |
| 2002/0181526 A1 * | 12/2002 | Gao | | 372/45 |
| 2003/0095582 A1 * | 5/2003 | Ackley | | 372/108 |
| 2003/0210721 A1 * | 11/2003 | Haneda et al. | | 372/46 |
| 2004/0026779 A1 * | 2/2004 | Cai et al. | | 257/712 |
| 2004/0155254 A1 * | 8/2004 | Cai et al. | | 257/98 |

* cited by examiner

*Primary Examiner*—James Menefee
*Assistant Examiner*—Phillip Nguyen
(74) *Attorney, Agent, or Firm*—Welsh & Katz, Ltd.

(57) ABSTRACT

A high-speed, directly modulated ridge waveguide laser includes: a ridge structure at a junction surface of the laser chip; and a plurality of pads only on non-active areas of the junction surface, where the plurality of pads protrude beyond an edge of the ridge structure. The laser chip can thus be held by a manufacturing tool, such that the manufacturing tool abuts the pads without abutting the ridge structure. In this manner, the ridge structure of the laser is protected from damage due to contacts by manufacturing tools, increasing the device yield of a wafer. By providing the pads only on the non-active areas of the junction surface, parasitic capacitance for contacts in the active areas can be properly controlled.

19 Claims, 4 Drawing Sheets

CROSS-SECTIONAL VIEW

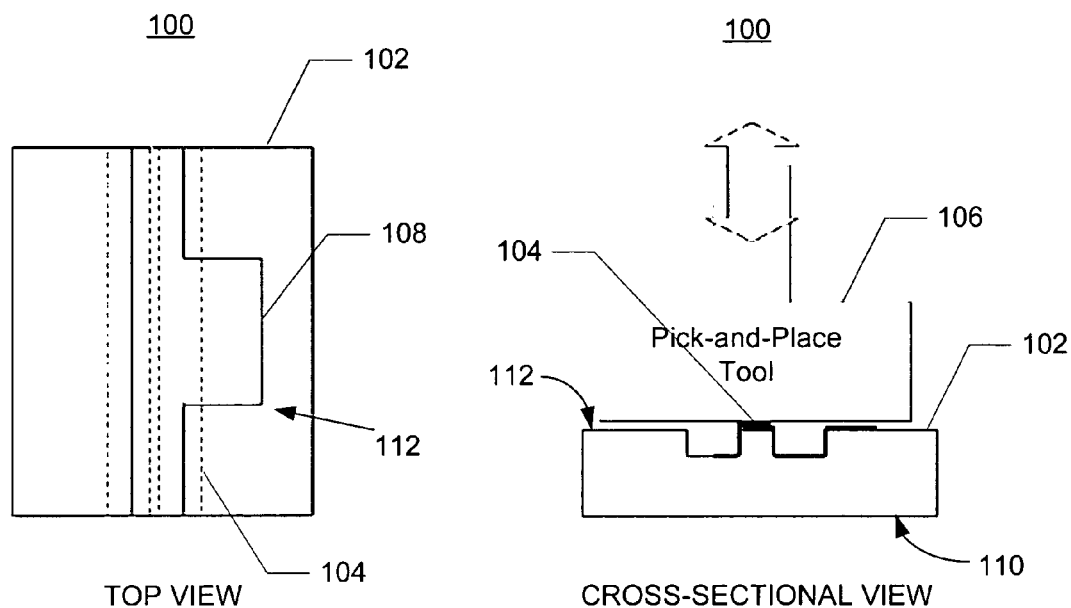
FIG. 1A
(Prior Art)
FIG. 1B
(Prior Art)
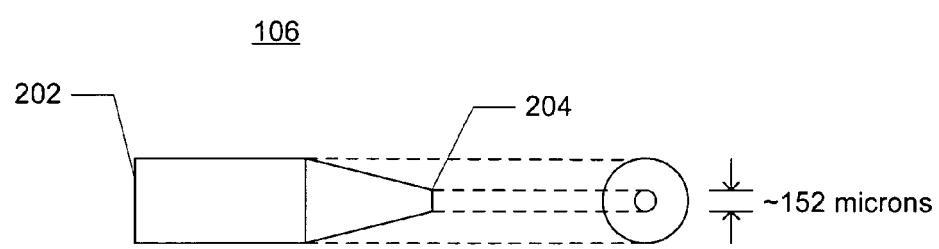
FIG. 2
(Prior Art)

TOP VIEW

CROSS-SECTIONAL VIEW

MECHANICAL PROTECTION FOR SEMICONDUCTOR EDGE-EMITTING RIDGE WAVEGUIDE LASERS

FIELD OF THE INVENTION

The present invention relates to ridge waveguide lasers, and more particularly to the protection of the ridge structure of a ridge waveguide laser against damage during manufacturing.

BACKGROUND OF THE INVENTION

High-speed, directly modulated semiconductor ridge waveguide lasers are well known in the art. "Directly modulated", as used in this specification, relates to lasers where the source current is modulated in time. "High-speed", as used in this specification, relates to lasers functioning at a frequency of 1 GHz or higher. FIGS. 1A and 1B illustrate a top view and a cross-sectional view, respectively, of a conventional high-speed, directly modulated ridge waveguide laser chip. The laser chip 100 comprises a substrate 102 with a mounting surface 110 and a junction surface 112. At the mounting surface 110, the laser chip 100 is eventually coupled to a submount, a printed circuit board, or some other surface. The laser chip 100 is thus mounted "junction side up". The junction surface 112 comprises a contact pad 108 and a ridge structure 104. Typically, the ridge structure 104 protrudes beyond the edge of the junction surface 112.

In large scale manufacturing of laser chips, a multitude of laser chips are formed on a semiconductor wafer. Each of these chips are then handled mostly with pick-and-place tools 106. Most pick-and-place tools possess vacuum collets for holding the laser chip. FIG. 2 illustrates a conventional pick-and-place collet. The collet typically comprises a shank 202 and a tip 204. The inner diameter of the tip 204 can be approximately 152 microns. To pick up a laser chip, a vacuum is created within the collet. The vacuum is released to place the laser chip 100.

However, because the ridge structure 104 protrudes beyond the edge of the junction surface 112, the ridge structure 104 suffers from mechanical damage due to the impact from the tool 106. This can render many laser chips on a wafer non-functional, adversely affecting the device yield of the wafer.

One approach for lower-speed lasers is described in U.S. Pat. No. 5,305,340. FIG. 3 illustrates this conventional approach for a "junction side down" mounted laser. The laser includes a substrate 30, cladding layers 32 and 36, an active region layer 34, and a ridge part 38. A protective material 40, specifically gold, are disposed on the surface of the active region layer 36. Protective walls 48, comprising gold as well, are formed on either side of the ridge element. These walls 48 prevent damage to the ridge element, whether the laser is mounted junction side down or up.

However, this conventional approach is problematic for high-speed, directly modulated ridge waveguide lasers. Due to the small size of such lasers, the connection of the walls 48 to the material 40 on the active region layer 36 would cause problems with parasitic capacitance at the contacts (layer 40). To properly control parasitic capacitance, contacts to the active region must be sufficiently small. For high-speed, directly modulated ridge waveguide lasers, this cannot be accomplished when the conductive material on the active region layer is connected to the conductive materials of the walls 48.

Accordingly, there exists a need for a method and apparatus for preventing damage to a ridge of a high-speed, directly modulated ridge waveguide laser during manufacturing. The method and apparatus should be easy and cost effective to implement, and be easily practiced with standard pick-and-place tools. The method and apparatus should also allow for the proper control of parasitic capacitance. The present invention addresses such a need.

SUMMARY OF THE INVENTION

A high-speed, directly modulated ridge waveguide laser includes: a ridge structure at a junction surface of the laser chip; and a plurality of pads only on non-active areas of the junction surface, where the plurality of pads protrude beyond an edge of the ridge structure. The laser chip can thus be held by a manufacturing tool, such that the manufacturing tool abuts the pads without abutting the ridge structure. In this manner, the ridge structure of the laser is protected from damage due to contacts by manufacturing tools, increasing the device yield of a wafer. By providing the pads only on the non-active areas of the junction surface, parasitic capacitance for contacts in the active areas can be properly controlled.

BRIEF DESCRIPTION OF THE FIGURES

FIGS. 1A and 1B illustrate a top view and a cross-sectional view, respectively, of a conventional high-speed, directly modulated ridge waveguide laser chip.

FIG. 2 illustrates a conventional pick-and-place collet.

DETAILED DESCRIPTION

The present invention provides a method and apparatus for preventing damage to a ridge of a high-speed, directly modulated ridge waveguide laser. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 4A through 5 in conjunction with the discussion below.

Figure 3:
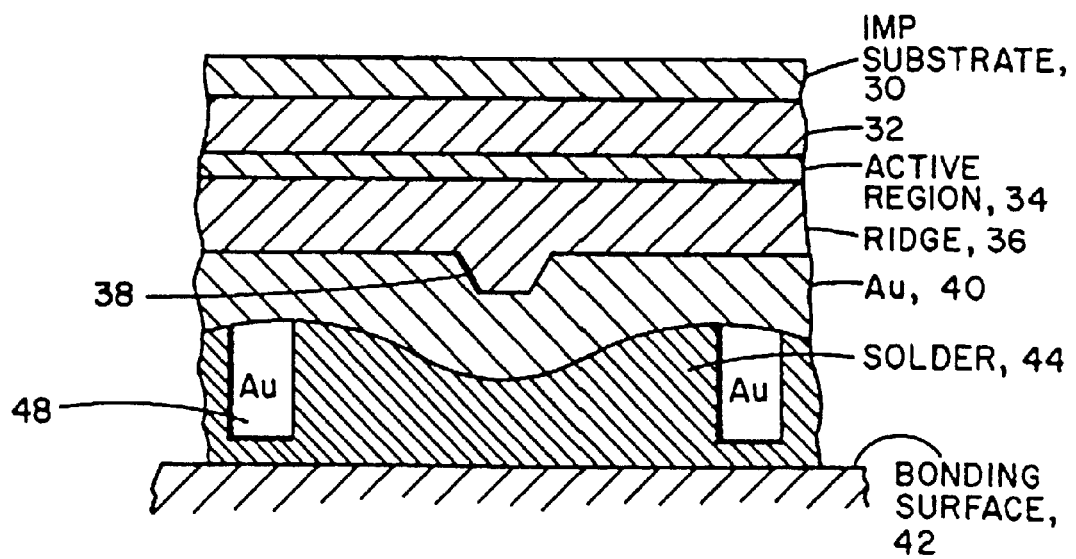
FIG. 3 illustrates a conventional approach for a "junction side down" mounted laser.
Figure 4A:
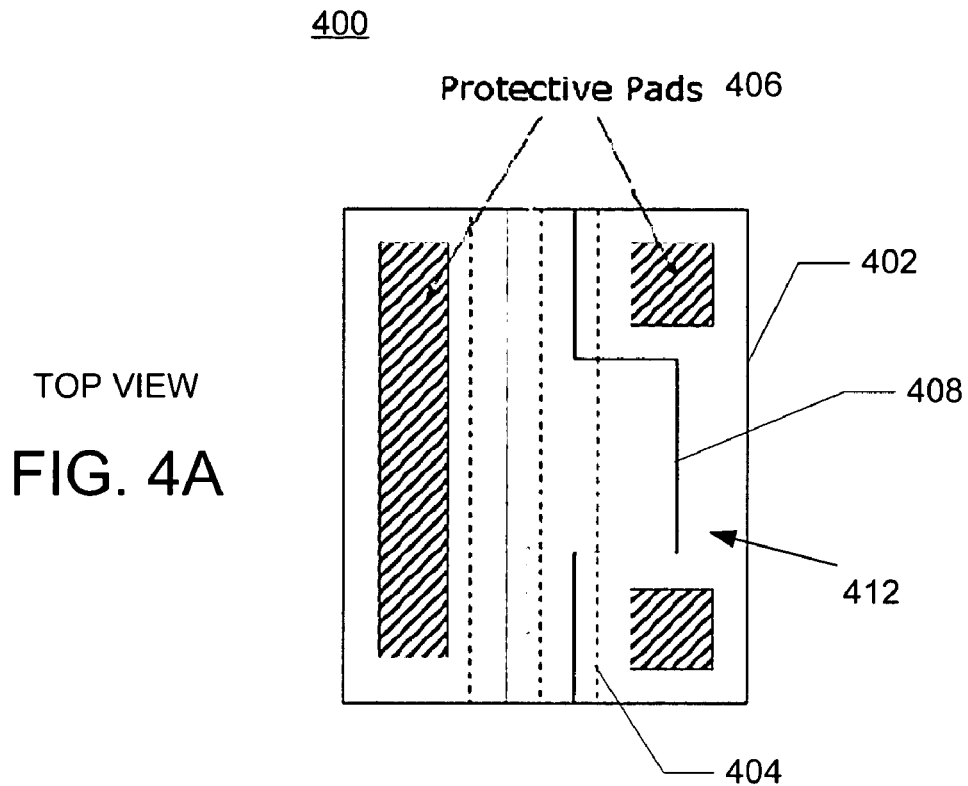
FIGS. 4A and 4B illustrate a top view and a cross-sectional view, respectively, of a preferred embodiment of an apparatus for preventing damage to a ridge of a high-speed, directly modulated ridge waveguide laser in accordance with the present invention.
Figure 4B:
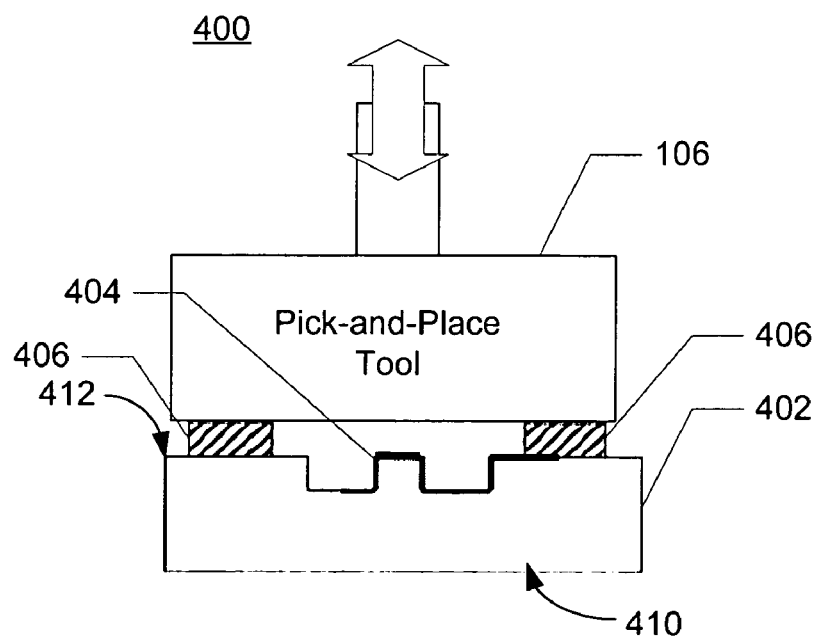

FIGS. 4A and 4B illustrate a top view and a cross-sectional view, respectively, of a preferred embodiment of an apparatus for preventing damage to a ridge of a high-speed, directly modulated ridge waveguide laser in accordance with the present invention. The laser chip 400 comprises a substrate 402 with a mounting surface 410 and a junction surface 412, a contact pad 408, a ridge structure 404 on the junction surface 412, and a plurality of protective pads 406 on the junction surface 412. At the mounting surface 410, the laser chip 400 is eventually coupled to a submount, a printed circuit board, or some other surface. The protective pads 406 reside only in the non-active areas of the junction surface 412 and protrude beyond the edge of the ridge structure 404. As illustrated in FIG. 4B, because the protective pads 406 protrude beyond the ridge structure 404, the pick-and-place tool 106 contacts the protective pads 406 instead of the ridge structure 404. The protective pads 406 absorb the force and stress from the pick-and-place tool 106, thus preventing the tool 106 from damaging the ridge structure 404. In the preferred embodiment, at least three protective pads 406 are used to provide even absorption of the stress from the tool 106. The protective pads 406 can comprise any material capable of withstanding such stress, including metallic and non-metallic materials. For example, dielectric, BCB, or polyimide materials may be used. The protective pads 406 are formed on the chip 400 during the manufacturing of the chip 400.

Figure 5:
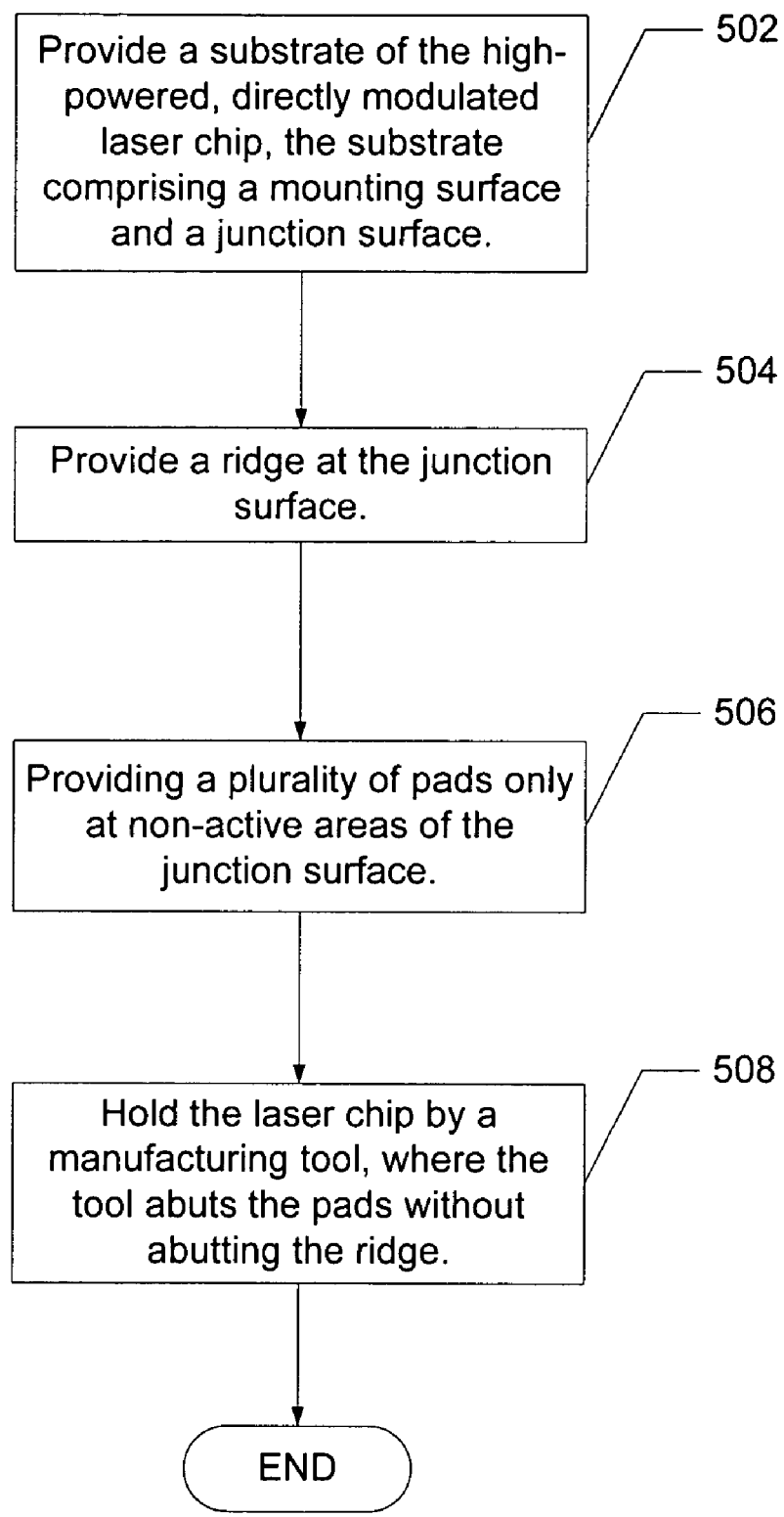
FIG. 5 illustrates a method for preventing damage to a ridge of a high-speed, directly modulated ridge waveguide laser in accordance with the present invention.

FIG. 5 illustrates a method for preventing damage to a ridge of a high-speed, directly modulated ridge waveguide laser in accordance with the present invention. First, a substrate 402 of the high-speed, directly modulated laser chip 400 is provided, where the substrate 402 comprises a mounting surface 410 and a junction surface 412, via step 502. Next, a ridge structure 404 is provided at the junction surface 412, via step 504. Other layers of the laser chip 400 are also provided, as is well known in the art. Then, a plurality of pads 406 is provided only at the non-active areas of the junction surface 412, via step 506. In the preferred embodiment, the pads 406 are not at any of the active areas of the junction surface 412 and do not connect with any of the contacts (not shown) at these active areas. The pads 406 can be formed using a variety of techniques, including but not limited to photolithography. With the pads 406, the laser chip 400 can be held by a manufacturing tool, such as a pick-and-place tool 106, where the tool abuts the pads 406 without abutting the ridge 404, via step 508.

In this manner, the ridge structure 404 of the laser chip 400 is protected from damage due to contacts by manufacturing tools. Protecting the ridge structures 404 from damage increases the device yield of a wafer. With the laser chips 400 in accordance with the present invention, standard manufacturing tools may be used without the need for expensive or cumbersome modifications. Such protection of the active areas is also maintained when the manufacturing tool is not optimized. For example, for pick-and-place tools using a vacuum to hold the laser chip, the vacuum force of the tool can be configured or optimized, without requiring precision alignment to avoid contact with the ridge. The vacuum force can also be adjusted for easier release of the laser chip, allowing for faster pick and place pace.

In addition, because the protective pads 406 are only at the non-active areas of the laser chip 400, the size of the contacts at the active areas remain small, allowing parasitic capacitance to be properly controlled. This allows for optimum protection, i.e., large area protective pads in non-active areas, with optimum RF design, i.e., limited area contacts in active areas. Furthermore, having the protective pads 406 only at the non-active areas allows for higher pick and place yield. If the protective pads 406 are damaged or accidentally removed, the contacts at the active areas remain intact. Thus, the laser chip 400 remains fully functional. In addition, the protective pads can function as reference reticles as well for the manufacturing tool.

A method and apparatus for preventing damage to a ridge of a high-speed, directly modulated ridge waveguide laser has been disclosed. The method and apparatus provide a plurality of protective pads that protrude beyond an edge of the ridge structure. The protective pads are only on the non-active areas of a junction surface of a laser chip. The laser chip can thus be held by a manufacturing tool, such that the manufacturing tool abuts the protective pads without abutting the ridge structure of the laser chip. In this manner, the ridge structure of the laser chip is protected from damage due to contacts by manufacturing tools, increasing the device yield of a wafer. By providing the protective pads only on the non-active areas of the junction surface, parasitic capacitance for the contacts in the active areas can be properly controlled.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of protecting a semiconductor device from damage during device processing comprising:
   providing a semiconductor wafer;
   providing a plurality of active semiconductor devices on the surface of the wafer wherein each active device is separated from other active devices by inactive semiconductor areas not including an active semiconductor device;
   providing a plurality of metallic pads around the periphery of an active device only in said inactive areas on the surface of the wafer, each pad having a greater relative height measured from the surface of the wafer than the height of any portion of a respective active device;
   dicing the wafer into a plurality of die; and
   removing a die from the wafer using a pick and place tool such that the pick and place tool only makes contact with the pads surrounding the active devices of the wafer.

2. The method of protecting the semiconductor device as in claim 1 wherein the active device further comprises a ridge waveguide laser.

3. The method of protecting the semiconductor device as in claim 1 wherein the plurality of pads further comprises three pads.

4. The method of protecting the semiconductor device as in claim 1 further comprising using the plurality of metallic pads as reticles.

5. A method of protecting a semiconductor device from damage during device processing comprising:
   providing a semiconductor wafer;
   providing a plurality of semiconductor chips on the surface of the wafer where each semiconductor chip includes an active area bounded by inactive semiconductor areas not including an active semiconductor device;
   providing a plurality of pads around the periphery of at least some semiconductor chips of the plurality of semiconductor chips only in said inactive areas on the surface of the at least some semiconductor chips, each pad having a greater relative height measured from the surface of the wafer than the height of any portion of a respective active device; and
   removing a semiconductor chip of the at least some semiconductor chips from the wafer using a pick and place tool such that the pick and place tool only makes contact with the pads surrounding the active area of the semiconductor chip.

6. The method of protecting the semiconductor device as in claim 5 wherein the active device further comprises a ridge waveguide laser.

7. The method of protecting the semiconductor device as in claim 5 wherein the plurality of pads further comprises three pads.

8. The method of protecting the semiconductor device as in claim 5 further comprising using the plurality of metallic pads as reticles.

9. The method of protecting the semiconductor device as in claim 5 wherein the plurality of pads further comprise metallic pads.

10. The method of protecting the semiconductor device as in claim 5 wherein the plurality of pads further comprise non-metallic pads.

11. The method of protecting the semiconductor device as in claim 5 wherein the non-metallic pads further comprise dielectric pads.

12. A method of protecting a semiconductor device from damage during device processing comprising:
providing a semiconductor wafer;
providing a semiconductor chip on the surface of the wafer where the semiconductor chip includes an active area with inactive semiconductor areas disposed on opposing sides of the active area and where the inactive semiconductor areas do not include an active semiconductor device;
providing a plurality of pads only in said inactive areas on the surface of the semiconductor chip, each pad having a greater relative height measured from the surface of the wafer than the height of any portion of a respective active device; and
removing the semiconductor chip from the wafer using a pick and place tool such that the pick and place tool only makes contact with the pads surrounding the active area of the semiconductor chip.

13. The method of protecting the semiconductor device as in claim 12 wherein the active device further comprises a ridge waveguide laser.

14. The method of protecting the semiconductor device as in claim 12 wherein the plurality of pads further comprises three pads.

15. The method of protecting the semiconductor device as in claim 12 further comprising using the plurality of metallic pads as reticles.

16. The method of protecting the semiconductor device as in claim 12 wherein the plurality of pads further comprise metallic pads.

17. The method of protecting the semiconductor device as in claim 12 wherein the plurality of pads further comprise non-metallic pads.

18. The method of protecting the semiconductor device as in claim 12 wherein the non-metallic pads further comprise dielectric pads.

19. A semiconductor comprising:
a plurality of active semiconductor devices disposed on the surface of the wafer wherein each active device is separated from other active devices by inactive semiconductor areas not including an active semiconductor device; and
a plurality of metallic pads disposed around the periphery of an active device only in said inactive areas on the surface of the wafer, each pad having a greater relative height measured from the surface of the wafer than the height of any portion of a respective active device and adapted for engaging respective contacts on an external pick and place tool that removes a die from the wafer, the greater relative height of the plurality of pads causing the pick and place tool to only make contact with the pads surrounding the active devices of the wafer.

* * * * *